United States Patent
Huh et al.

(10) Patent No.: US 7,864,257 B2
(45) Date of Patent: Jan. 4, 2011

(54) THIN FILM TRANSISTOR AND METHOD OF MANUFACTURING THE SAME

(75) Inventors: Jong-Moo Huh, Hwaseong-si (KR);
Joon-Hoo Choi, Seoul (KR);
Seung-Kyu Park, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 343 days.

(21) Appl. No.: 12/174,522

(22) Filed: Jul. 16, 2008

(65) Prior Publication Data

US 2009/0159887 A1    Jun. 25, 2009

(30) Foreign Application Priority Data

Dec. 24, 2007    (KR) .................. 10-2007-136827

(51) Int. Cl.
*G02F 1/136*    (2006.01)
*H01L 31/00*    (2006.01)

(52) U.S. Cl. .................. 349/47; 257/59; 257/E29.003; 257/E21.143

(58) Field of Classification Search .................. 257/59, 257/72, 81, 99, 40, E29.003, E21.143; 349/47, 349/43, 42, 110, 138, 141, 143; 438/151, 438/149, 158
See application file for complete search history.

(56) References Cited

U.S. PATENT DOCUMENTS

| | | | | |
|---|---|---|---|---|
| 5,061,648 A | * | 10/1991 | Aoki et al. | 438/161 |
| 5,097,297 A | * | 3/1992 | Nakazawa | 257/347 |
| 5,191,453 A | * | 3/1993 | Okumura | 349/47 |
| 6,692,899 B2 | * | 2/2004 | Lai | 430/311 |
| 2004/0263948 A1 | * | 12/2004 | Lee et al. | 359/296 |
| 2006/0202204 A1 | * | 9/2006 | Choi et al. | 257/59 |

FOREIGN PATENT DOCUMENTS

| | | |
|---|---|---|
| JP | 2001-215530 | 8/2001 |
| JP | 2006-058676 | 3/2006 |
| KR | 1020050056217 | 6/2005 |

* cited by examiner

*Primary Examiner*—Thomas L Dickey
*Assistant Examiner*—Nikolay Yushin
(74) *Attorney, Agent, or Firm*—Innovation Counsel LLP

(57) ABSTRACT

A thin film transistor and a method of manufacturing the thin film transistor is disclosed. The thin film transistor includes first and second ohmic contact layers, an activation layer, an insulating layer, a source electrode formed on the insulating layer and connected to the first ohmic contact layer through first contact hole, a drain electrode formed on the insulating layer and connected to the second ohmic contact layer through second contact hole, a gate electrode formed on the insulating layer between the source electrode and the drain electrode and overlapping the activation layer, and a protective layer formed on the source electrode, the drain electrode, and the gate electrode.

19 Claims, 5 Drawing Sheets

THIN FILM TRANSISTOR AND METHOD OF MANUFACTURING THE SAME

CROSS-REFERENCE TO RELATED APPLICATION

This application claims priority to and the benefit of Korean Patent Application No. 10-2007-0136827 filed in the Korean Intellectual Property Office on Dec. 24, 2007, the disclosure of which is incorporated herein by reference in its entirety.

BACKGROUND OF THE INVENTION

1. Field of the Invention

The present invention relates generally to a thin film transistor (TFT) for an organic light emitting diode (OLED) device, and a method of manufacturing the thin film transistor.

2. Description of the Related Art

Today, society has become more information-oriented than in the past. To display and convey the desired information, demand for high-performance displays, which can rapidly represent various data in the form of images, graphics, letters, etc. has been on the rise. A consequence of this rising demand for high-performance displays is the sharp growth of display-related industries.

As communication devices such as personal computers (PCs), mobile phones, personal digital assistances (PDAs), etc., become slimmer and lighter, their display components are correspondingly required to be slimmer and lighter. For this reason, popularity of the heavy and bulky cathode ray tubes (CRTs) that once dominated the display industry is waning. Flat panel displays, such as organic light emitting diode (OLED) displays, are rising in popularity as an attractive alternative to CRTs. The OLEDs, which are self-emission displaying means, allow low power consumption and are compact in size compared to other displays. Therefore, the OLEDs are often considered to be the "next generation displays" to dominate the display industry.

OLED displays include thin film transistors (TFTs) to drive the display signals. TFTs in OLED displays generally have more complicated structures than TFTs in other flat displays, such as liquid crystal displays (LCDs), due to inherent limitations to the manufacturing processes and structures, which may make it difficult for the TFTs to be applicable to various TFT backplane structures and wiring.

Therefore, there is a need of TFTs for OLEDs having an improved structure to overcome such limitations.

SUMMARY OF THE INVENTION

The present invention provides a thin film transistor for an organic light emitting diode device, having an improved structure to overcome limitations to the manufacturing process and structures of the OLEDs.

The present invention also provides a method of manufacturing the thin film transistor.

One exemplary embodiment of the present invention provides a thin film transistor including: first and second ohmic contact layers, activation layer, an insulating layer, a source electrode, a drain electrode, a gate electrode and a protective layer. The first and second ohmic contact layers are formed on an insulating substrate, and the activation layer is formed on the insulating substrate and the first and second ohmic contact layers, and the insulating layer is formed on the activation layer, and the source electrode is formed on the insulating layer and electrically connected to the first ohmic contact layer through a first contact hole, and the first contact hole extends through the activation layer and the insulating layer to the first ohmic contact layer, and the drain electrode is formed on the insulating layer and electrically connected to the second ohmic contact layer through a second contact hole, and the second contact hole extends through the activation layer and the insulating layer to the second ohmic contact layer; a gate electrode formed on the insulating layer between the source electrode and the drain electrode and overlapping the activation layer, and the protective layer formed on the source electrode, the drain electrode, and the gate electrode.

The source electrode, the drain electrode, and the gate electrode may be formed from substantially the same layer.

The protective layer has a third contact hole extending to the drain electrode so that the drain electrode is electrically connected to a pixel electrode.

A distance between the source electrode and the gate electrode ranges from about 1 μm to about 20 μm.

A distance between the drain electrode and the gate electrode may range from about 1 μm to about 20 μm.

The distance between an end of the gate electrode and an end of each of the first and second ohmic contact layers may range from about −4 μm to about 20 μm, wherein the distance is measured ni a direction that is parallel to a surface of the insulating substrate on which layers are formed.

The activation layer may be formed of crystalline silicon or amorphous silicon.

The insulating layer may be formed of silicon oxide (SiOx) or silicon nitride (SiNx).

The source electrode, the drain electrode, and the gate electrode may be formed of a conductive metal.

The protective layer may be formed of silicon oxide (SiOx) or silicon nitride (SiNx).

In another aspect, the present invention provides a method of manufacturing a thin film transistor. In the method of manufacturing the thin film transistor, first and second ohmic contact layers are formed on an insulating substrate, and an activation layer is formed on the insulating substrate, and the first and second ohmic contact layers, and an insulating layer is formed on the activation layer, and first and second contact holes are formed that extend through the activation layer and the insulating layer to the first and second ohmic contact layers, respectively, and a metal layer is formed on the insulating layer to be connected to the first and second ohmic contact layers, and the metal layer is patterned to form a gate electrode, and a source electrode and a drain electrode spaced from the gate electrode, and a protective layer is formed on the source electrode, the drain electrode, and the gate electrode.

The method may further include: forming a third contact hole extending to the drain electrode, the third contact hole extending through the protective layer.

A distance between the source electrode and the gate electrode may range from about 1 μm to about 20 μm.

A distance between the drain electrode and the gate electrode may range from about 1 μm to about 20 μm.

The distance between an end of the gate electrode and an end of each of the first and second ohmic contact layers may range from about −4 μm to about 20 μm wherein the distance is measured in a direction that is parallel to a surface of the insulating substrate on which the activation layer is formed.

The activation layer may be formed of crystalline silicon or amorphous silicon.

The insulating layer may be formed of silicon oxide (SiOx) or silicon nitride (SiNx).

The insulating layer may be formed of silicon oxide (SiOx) or silicon nitride (SiNx).

BRIEF DESCRIPTION OF THE DRAWINGS

The above and other features of the present invention will be described in reference to certain exemplary embodiments thereof with reference to the attached drawings in which.

DETAILED DESCRIPTION

Figure 1:
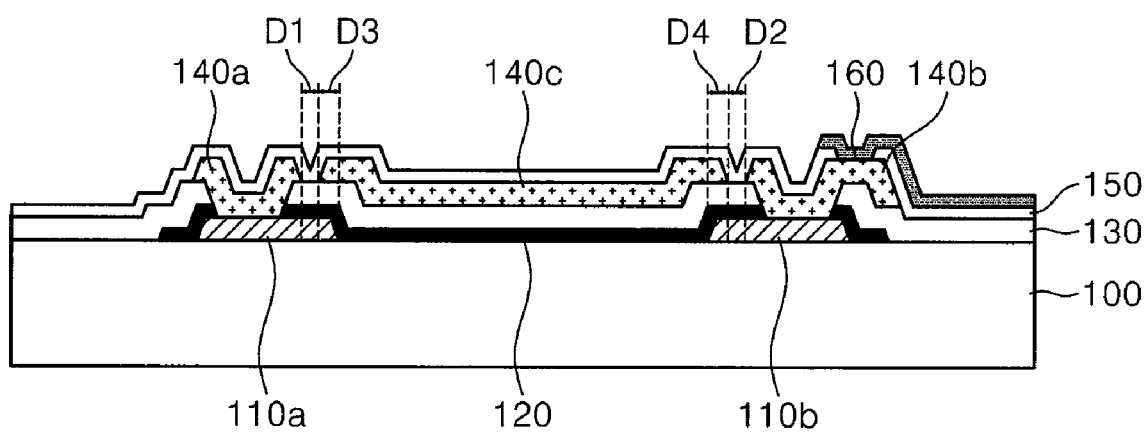
FIG. 1 is a cross-sectional view of a thin film transistor according to an exemplary embodiment of the present invention.

The invention now will be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present there between. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, exemplary embodiments of the present invention will be described in more detail with reference to FIGS. 1 and 2A to 2J.

FIG. 1 is a cross-sectional view of a thin film transistor according to an exemplary embodiment of the present invention.

Referring to FIG. 1, the thin film transistor includes first and second ohmic contact layers 110a and 110b, an activation layer 120, an insulating layer 130, a source electrode 140a, a drain electrode 140b, a gate electrode 140c, and a protective layer 150.

The first and second ohmic contact layers 110a and 110b are spaced apart from each other on an insulating substrate 100 by a prescribed separation distance to improve contact resistance properties between the activation layer 120 and the source electrode 140a, and between the activation layer 120 and the drain electrode 140b. The first and second ohmic contact layers 110a and 110b may be formed of, for example, ion-doped amorphous silicon.

The activation layer 120 covers parts of the first and second ohmic contact layers 110a and 110b and a part of the insulating substrate 120 between the first and second ohmic contact layers 110a and 110b. The activation layer 120 may be formed of, for example, crystalline silicon or amorphous silicon.

The insulating layer 130 is disposed on the activation layer 120 to insulate the activation layer 120 and the gate electrode 140c from each other. The insulating layer 130 may be formed of, for example, silicon oxide (SiOx) or silicon nitride (SiNx).

Figure 2A:
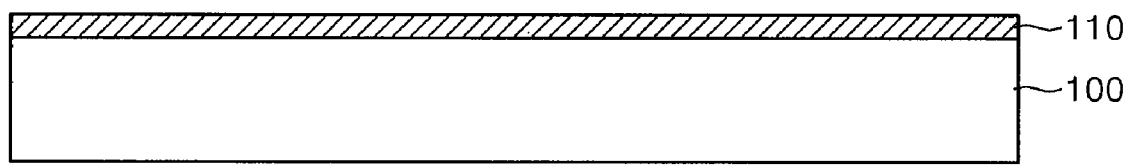
FIGS. 2A to 2K are cross-sectional views for illustrating a process of manufacturing a TFT according to an exemplary embodiment of the present invention.
Figure 2B:
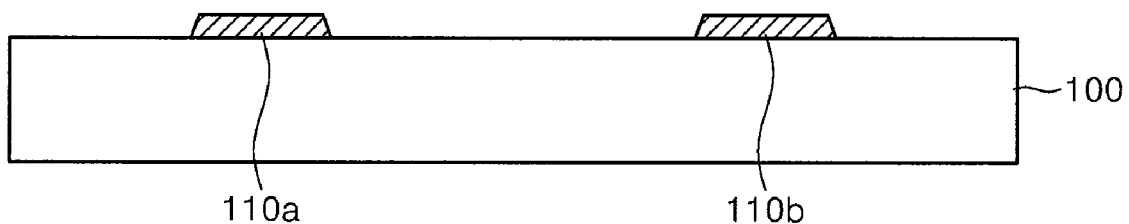
Figure 2C:
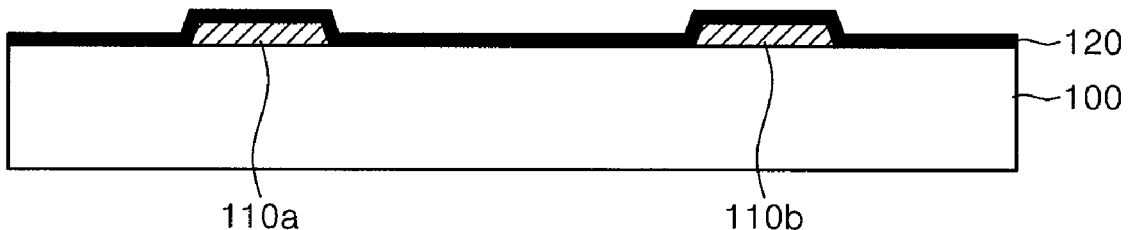
Figure 2D:
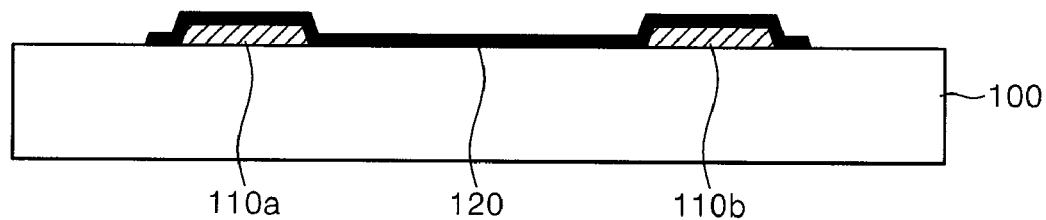
Figure 2E:
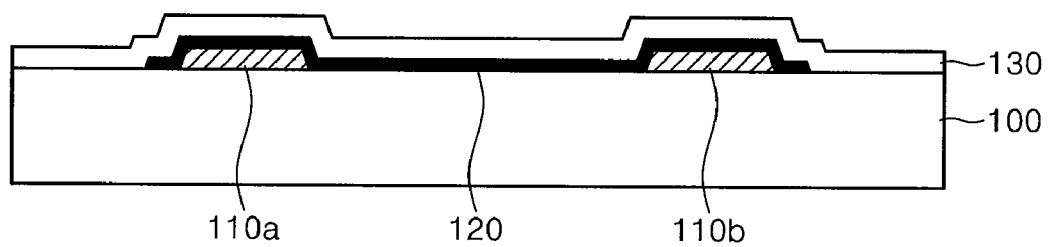
Figure 2F:
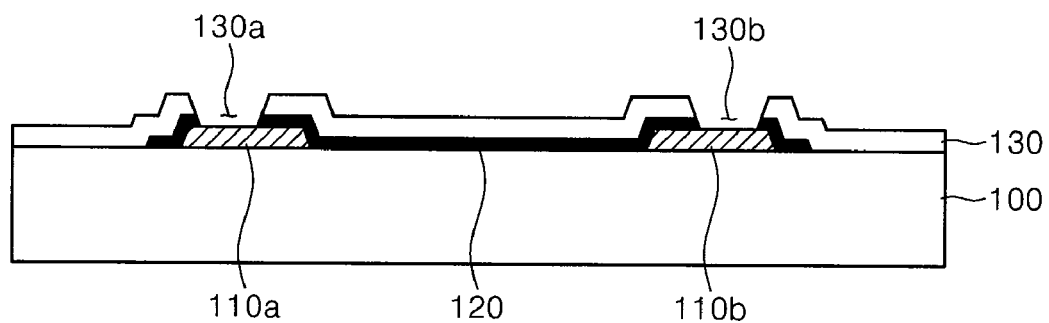

Referring to FIG. 2F, first and second contact holes 130a and 130b extend through the insulating layer 130 and activation layer 120 to expose the first and second ohmic contact layers 110a and 110b.

The source electrode 140a, drain electrode 140b, and gate electrode 140c are disposed on the insulating layer 130. The source electrode 140a and drain electrode 140b are electrically connected to the first and second ohmic contact layers 110a and 110b through the first and second contact holes 130a and 130b, respectively. The gate electrode 140c is located between the source electrode 140a and drain electrode 140b and separated from the source electrode 140a and drain electrode 140b. Also, the gate electrode 140c overlaps the activation layer 120.

The source electrode 140a, the drain electrode 140b, and gate electrode 140c are patterned on the same layer, thus preventing possible misalignments. Also, the number of insulating layers 130 can be reduced. Thus, the process and structure may be simplified.

The distance D1 between the source electrode 140a and the gate electrode 140c may range from 1 μm to 20 μm, and the distance D2 between the drain electrode 140b and the gate electrode 140c may range from 1 μm to 20 μm. And, the distances D3 and D4 between an end of the gate electrode 140c and an end of each of the first and second ohmic contact layers 110a and 110b may range from −4 μm to 20 μm. In the distances D3 and D4, a negative sign indicates that the gate electrode 140c overlaps the first or second ohmic contact layers 110a and 110b by the distance D3 or D4, and a positive sign indicates that the gate electrode 140c is spaced apart from each of the first and second ohmic contact layers 110a and 110b by the distances D3 and D4. The distances D3 and D4 may be same or different.

As shown in FIG. 1, distances D1, D2, D3, and D4 are measured in a direction that is parallel to the surface of the insulating substrate 100 on which the layers (e.g., the activation layer 120) are formed.

The protective layer 150 is formed on the source electrode 140a, drain electrode 140b, and gate electrode 140c. The insulating layer 150 may be formed of, for example, silicon oxide (SiOx) or silicon nitride (SiNx).

Figure 2G:
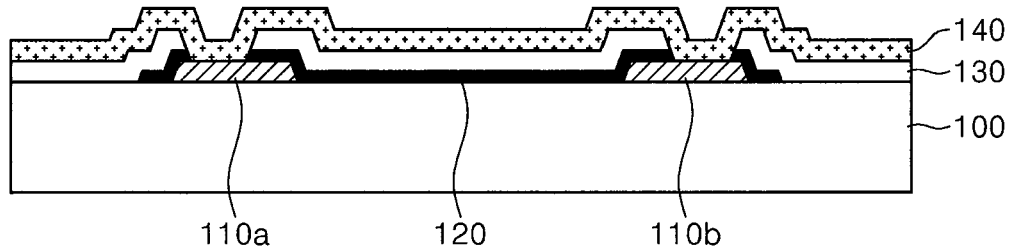
Figure 2H:
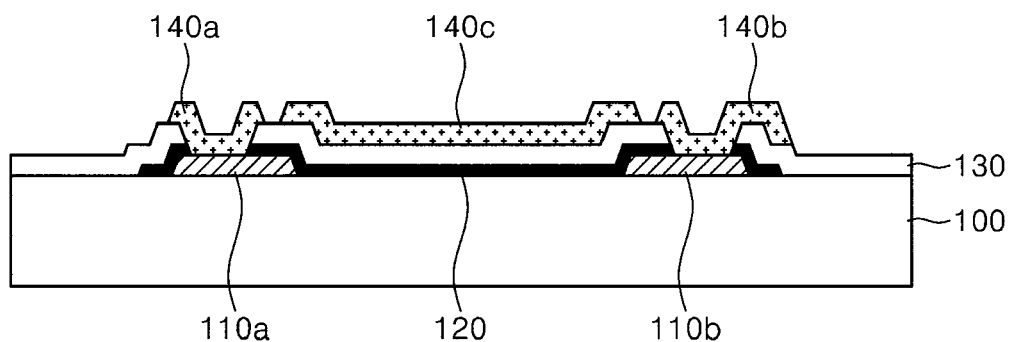
Figure 2I:
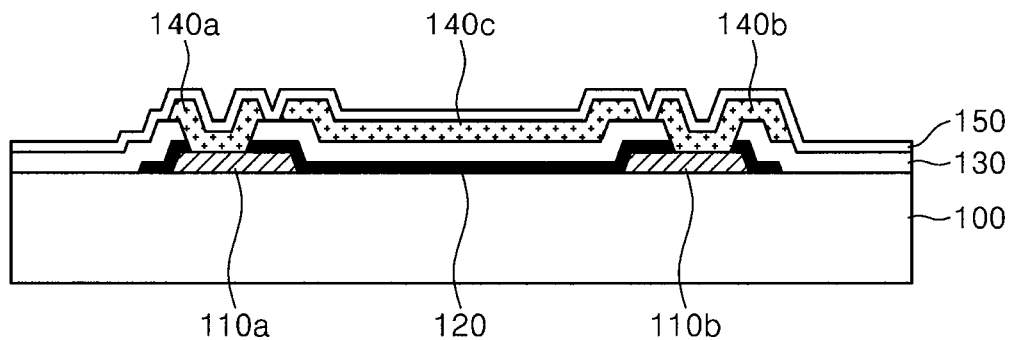
Figure 2J:
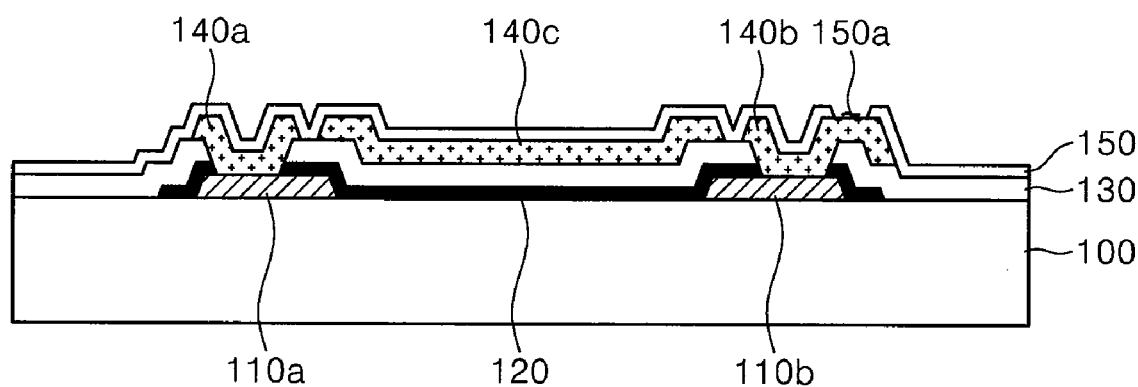

Referring to FIG. 2J, the protective layer 150 may have a third contact hole 150a, and the third contact hole 150a exposes a part of the drain electrode 140b so that the drain electrode 140b can be connected to the pixel electrode 160. FIGS. 2A to 2J are views for illustrating a process of manufacturing a TFT according to an exemplary embodiment of the present invention.

Referring to FIGS. 2A and 2B, the first and second ohmic contact layers 110a and 110b are formed on the insulating substrate 100. More specifically, an ion-doped amorphous silicon layer 110 is deposited on the insulating substrate 110 by a deposition method, such as PECVD (Plasma Enhanced Convention Vapor Deposition), and then the first and second ohmic contact layers 110a and 110b are patterned by a photolithography process using a mask. The ion-doped amorphous silicon layer 110 may be phosphorous doped amorphous silicon layer or boron doped amorphous silicon layer. The ion-doped amorphous silicon layer 110 may be deposited on the insulating substrate 100 by an ion implantation process or ion shower process.

Referring to FIGS. 2C and 2D, the activation layer 120 is formed to cover the first and second ohmic contact layers 110a and 110b and a part of the insulating substrate 100 between the first and second ohmic contact layers 110a and 110b. More specifically, an amorphous silicon layer is deposited on the first and second ohmic contact layers 110a and 110b by a deposition method, such as PECVD, and then patterned using photolithography and etching process to complete the activation layer 120. Before the deposition of the amorphous silicon layer, the top surfaces of the first and second ohmic contact layers 110a and 110b may be treated by a process, such as dehydration, HF washing, $H_2Pt$ treatment, etc.

The dual layer of the activation layer 120 and each of the first and second ohmic contact layers 110a and 110b may undergo solid phase crystallization (SPC) process. The SPC process may create an ion-doped contact portion on the upper parts of the ohmic contact layers 110a and 110b, thereby improving contact properties between the activation layer 120 and ohmic contact layers 110a and 110b. The patterning of ion-doped layer progresses simultaneously with the SPC process, thus eliminating any necessity of additional processes.

Referring to FIG. 2E, the insulating layer 130 is formed on the activation layer 120. The insulating layer 130 may be formed of, for example, silicon oxide (SiOx) or silicon nitride (SiNx).

Referring to FIG. 2F, the first and second contact holes 130a and 130b are disposed on the insulating layer 130 and activation layer 120. The first and second ohmic contact layers 110a and 110b may be formed using, for example, photolithography and etching process. The first and second ohmic contact layers 110a and 110b make contact with a metal layer 140 through the first and second contact holes 130a and 130b, respectively, which will be subsequently formed.

Referring to FIG. 2G, the metal layer 140 is formed on the insulating layer 130 to make contact with the first and second ohmic contact layers 110a and 110b. The metal layer 130 may be formed by sputtering.

In FIG. 2H, the metal layer 140 is patterned to form the source electrode 140a, drain electrode 140b, and gate electrode 140c. The source electrode 140a, drain electrode 140b, and gate electrode 140c may be formed using photolithography and etching process. The source electrode 140a and drain electrode 140b are electrically connected to the first and second ohmic contact layers 110a and 110b through the first and second contact holes 130a and 130b, respectively. The gate electrode 140c is located between the source electrode 140a and drain electrode 140b and separated from the source electrode 140a and drain electrode 140b. Also, the gate electrode 140c overlaps the activation layer 120.

Figure 2K:
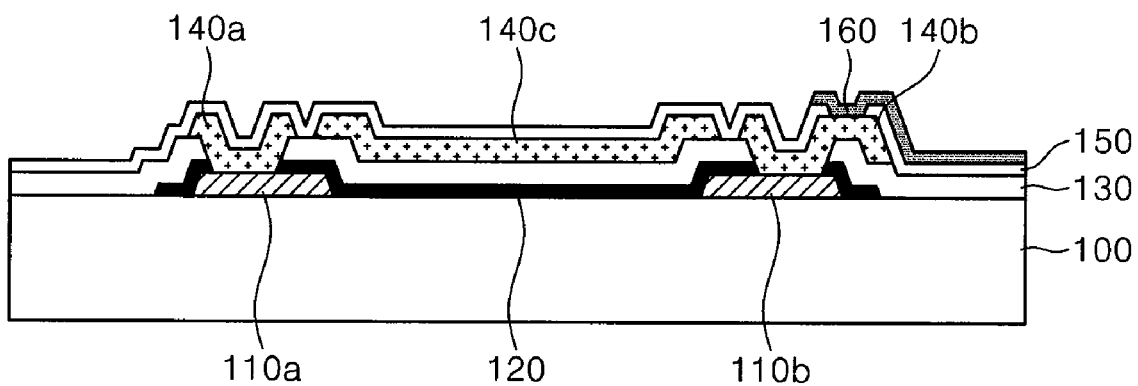

Referring to FIG. 2I, the protective layer 150 is formed on the source electrode 140a, drain electrode 140b, and gate electrode 140c. The insulating layer 150 may be formed of, for example, silicon oxide (SiOx) or silicon nitride (SiNx), using, for example, PECVD. Referring to FIG. 2J, the protective layer 150 is partially removed to form the third contact hole 150a to expose the drain electrode 140b. Referring to FIG. 2K, the drain electrode 140b is electrically connected to the pixel electrode 160 through the third contact hole 150a.

As described above, the TFTs according to exemplary embodiments of the present invention can overcome their structural limitations to be applicable to various backplane structures and wiring.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A thin film transistor comprising:
   first and second ohmic contact layers formed on an insulating substrate;
   an activation layer formed on the insulating substrate and the first and second ohmic contact layers;
   an insulating layer formed on the activation layer;
   a source electrode formed on the insulating layer and electrically connected to the first ohmic contact layer through a first contact hole, the first contact hole extending through the activation layer and the insulating layer to the first ohmic contact layer;
   a drain electrode formed on the insulating layer and electrically connected to the second ohmic contact layer through a second contact hole, the second contact hole extending through the activation layer and the insulating layer to the second ohmic contact layer;
   a gate electrode formed on the insulating layer between the source electrode and the drain electrode and overlapping the activation layer; and
   a protective layer formed on the source electrode, the drain electrode, and the gate electrode.

2. The thin film transistor of claim 1, wherein the source electrode, the drain electrode, and the gate electrode are formed from substantially the same layer.

3. The thin film transistor of claim 1, wherein the protective layer has a third contact hole extending to the drain electrode so that the drain electrode is electrically connected to a pixel electrode.

4. The thin film transistor of claim 1, wherein a distance between the source electrode and the gate electrode ranges from about 1 µm to about 20 µm.

5. The thin film transistor of claim 1, wherein a distance between the drain electrode and the gate electrode ranges from about 1 µm to about 20 µm.

6. The thin film transistor of claim 1, wherein a distance between an end of the gate electrode and an end of each of the first and second ohmic contact layers ranges from about −4 µm to about 20 µm, the negative sign in the distance indicating that the gate electrode overlaps the first or second ohmic contact layer, and wherein the distance is measured in a direction that is parallel to a surface of the insulating substrate on which the activation layer is formed.

7. The thin film transistor of claim 1, wherein the activation layer comprises crystalline silicon or amorphous silicon.

8. The thin film transistor of claim 1, wherein the insulating layer comprises silicon oxide (SiOx) or silicon nitride (SiNx).

9. The thin film transistor of claim 1, wherein the source electrode, the drain electrode, and the gate electrode are formed of a conductive metal.

10. The thin film transistor of claim 1, wherein the protective layer comprises silicon oxide (SiOx) or silicon nitride (SiNx).

11. A method of manufacturing a thin film transistor, comprising:
    forming first and second ohmic contact layers on an insulating substrate;
    forming an activation layer on the insulating substrate, and the first and second ohmic contact layers;
    forming an insulating layer on the activation layer;
    forming first and second contact holes, that extend through the activation layer and the insulating layer to the first and second ohmic contact layers, respectively;
    forming a metal layer on the insulating layer to be electrically connected to the first and second ohmic contact layers;
    patterning the metal layer to form a gate electrode, and a source electrode and a drain electrode spaced from the gate electrode; and
    forming a protective layer on the source electrode, the drain electrode, and the gate electrode.

12. The method of claim 11, further comprising:
    forming a third contact hole extending to the drain electrode, the third contact hole extending through the protective layer.

13. The method of claim 11, wherein a distance between the source electrode and the gate electrode ranges from about 1 µm to about 20 µm.

14. The method of claim 11, wherein a distance between the drain electrode and the gate electrode ranges from about 1 µm to about 20 µm.

15. The method of claim 11, wherein a distance between an end of the gate electrode and an end of each of the first and second ohmic contact layers ranges from about −4 µm to about 20 µm, the negative sign in the distance indicating that the gate electrode overlaps the first or second ohmic contact layer, and wherein the distance is measured in a direction that is parallel to a surface of the insulating substrate on which the activation layer is formed.

16. The method of claim 11, wherein the activation layer comprises crystalline silicon or amorphous silicon.

17. The method of claim 11, wherein the insulating layer comprises silicon oxide (SiOx) or silicon nitride (SiNx).

18. The method of claim 11, wherein the insulating layer comprises silicon oxide (SiOx) or silicon nitride (SiNx).

19. An organic light emitting diode (OLED) device comprising a thin film transistor, wherein the thin film transistor comprises:
    first and second ohmic contact layers formed on an insulating substrate;
    an activation layer formed on the insulating substrate and the first and second ohmic contact layers;
    an insulating layer formed on the activation layer;
    a source electrode formed on the insulating layer and electrically connected to the first ohmic contact layer through a first contact hole, the first contact hole extending through the activation layer and the insulating layer to the first ohmic contact layer;
    a drain electrode formed on the insulating layer and electrically connected to the second ohmic contact layer through a second contact hole, the second contact hole extending through the activation layer and the insulating layer to the second ohmic contact layer;
    a gate electrode formed on the insulating layer between the source electrode and the drain electrode and overlapping the activation layer; and
    a protective layer formed on the source electrode, the drain electrode, and the gate electrode.

* * * * *